United States Patent [19]

McKenzie et al.

[11] Patent Number: 4,568,917
[45] Date of Patent: Feb. 4, 1986

[54] CAPACITIVE DIGITAL TO ANALOG CONVERTER WHICH CAN BE TRIMMED UP AND DOWN

[75] Inventors: James A. McKenzie; Joe W. Peterson, both of Austin, Tex.

[73] Assignee: Motorola, Inc., Schaumburg, Ill.

[21] Appl. No.: 507,890

[22] Filed: Jun. 27, 1983

[51] Int. Cl.[4] ............................................. H03K 13/02
[52] U.S. Cl. ........................ 340/347 CC; 340/347 DA
[58] Field of Search ................. 340/347 DA, 347 CC, 340/347 AD

[56] References Cited

U.S. PATENT DOCUMENTS 4,028,694 6/1977 Cook et al. .................. 340/347 AD
4,338,590 7/1982 Connolly, Jr. et al. ....... 340/347 CC
4,399,426 8/1983 Tan ............................... 340/347 AD
4,476,456 10/1984 Domogalla .................... 340/347 CC Primary Examiner—Clifford C. Shaw
Attorney, Agent, or Firm—Anthony J. Sarli, Jr.; Jeffrey Van Myers; Robert L. King

[57] ABSTRACT

A capacitive digital to analog converter which can be trimmed to obtain precise capacitor matching is provided. The trimming method may be utilized with a weighted capacitive D/A converter having a scaling capacitor and an ordered plurality of capacitors for developing an analog output signal as a function of a digital input code. A compensation portion is coupled to at least a predetermined one of the capacitors for selectively changing the effective capacitive value of the predetermined capacitor.

14 Claims, 11 Drawing Figures

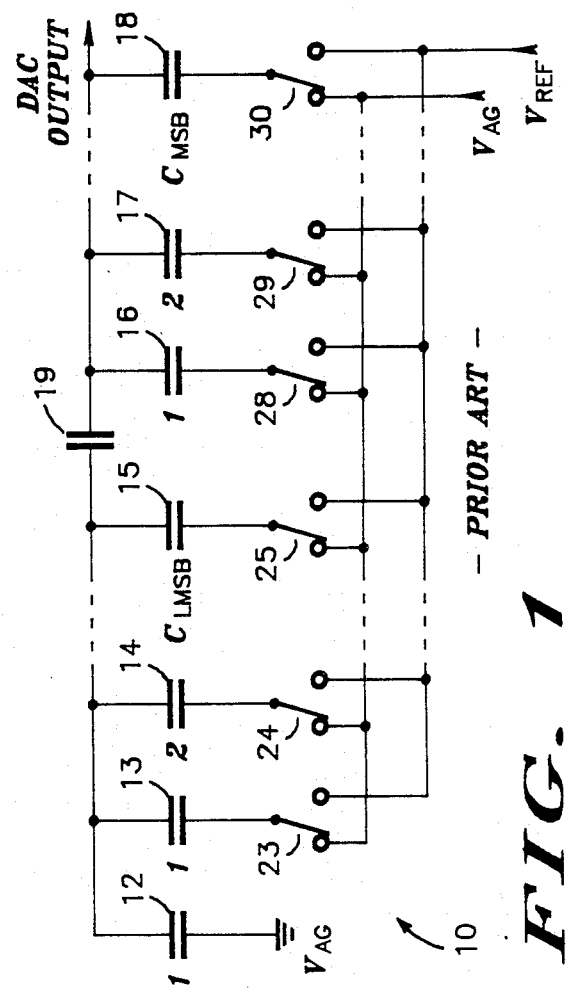
FIG. 1 — PRIOR ART —

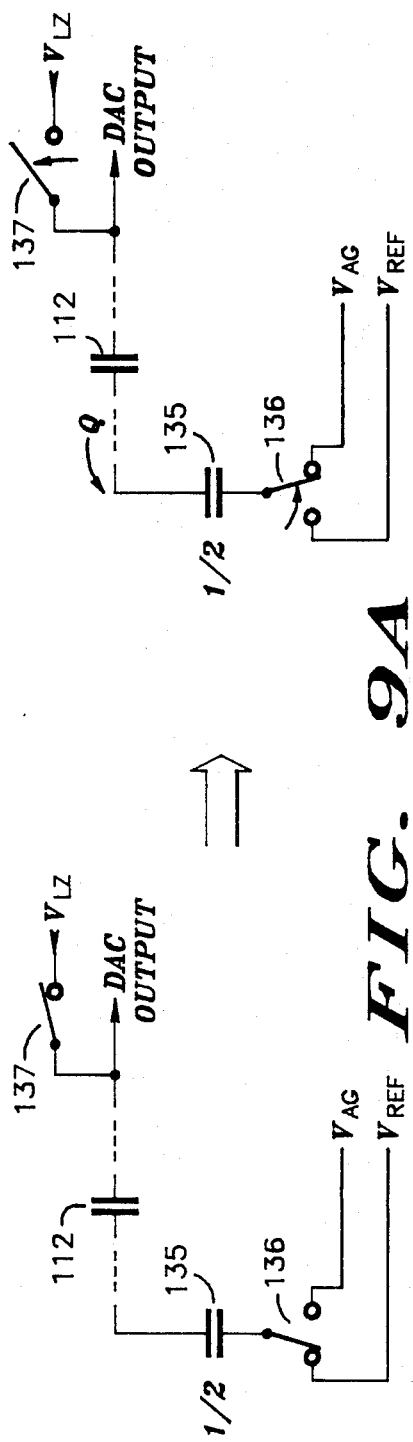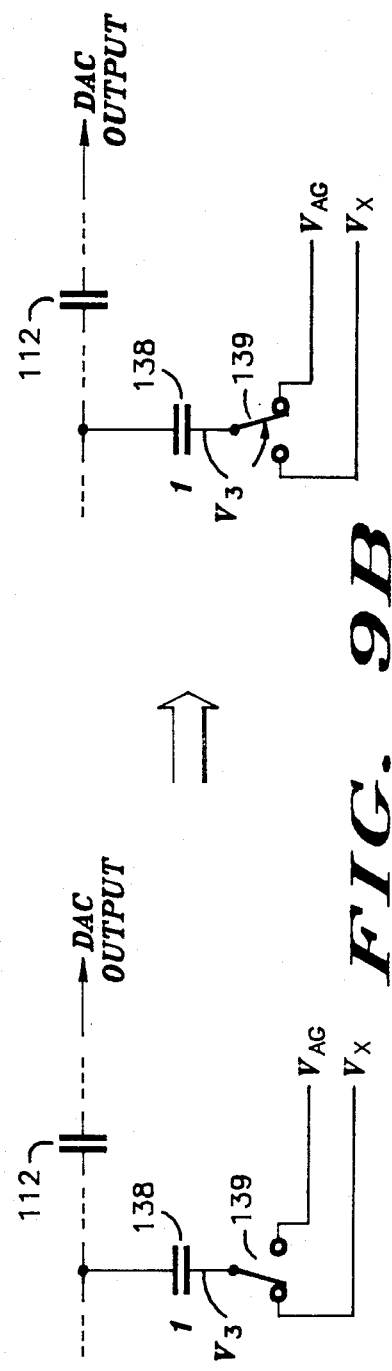
FIG. 9A
FIG. 9B

CAPACITIVE DIGITAL TO ANALOG CONVERTER WHICH CAN BE TRIMMED UP AND DOWN

TECHNICAL FIELD

This invention relates generally to digital to analog converters and, more particularly, to error compensation of capacitive digital to analog converters.

BACKGROUND ART

Digital to analog converters (DACS) having precise component values are difficult to fabricate. A known method to provide a digital to analog converter with precise component values is to use a resistive DAC and to precisely trim the values of the resistors. This is commonly implemented by using thin-film resistors which are laser trimmed. Thin-film resistors are implemented by putting a thin film layer over a thick field oxide layer. However, laser trimming is generally restricted to thin film processing and must be implemented before packaging at a wafer probe stage. If the die is stressed during or after packaging, the value of the resistors may change. Another known method of generalized resistor trimming which does not require thin film processing for obtaining a more precise DAC is to use a resistor of a predetermined value coupled in parallel to a plurality of discrete resistors of substantially larger value by parallel links. Selected links are then disconnected to obtain a precise resistive value.

Yet another method of providing a precise DAC is to use a PROM for offset, linearity, full-scale calibration or temperature compensation as disclosed by Barry Harvey in an article entitled "A Monolithic 12b System DAC", in the *IEEE International Solid-State Circuits Conference*, February, 1983, pp. 182–183. A PROM is used to selectively couple currents to various internal nodes thereby correcting the DAC by injecting a compensating current to null output errors created in part by non-ideal device parameters. Existing D/A converters predominately apply compensation techniques in bipolar integrated circuit technologies.

Unfortunately, capacitors cannot be reliably laser trimmed. Since capacitors are formed by separating two conductive layers with a thin dielectric, such as oxide for MOS capacitors, laser trimming typically short circuits a capacitor. Further, this method of trimming must be done prior to final packaging of an integrated circuit and is therefore subject to variation.

SUMMARY OF THE INVENTION

It is an object of the present invention to provide an improved capacitive digital to analog converter which can be trimmed.

Another object of this invention is to provide precise capacitive values in a capacitive DAC.

A further object of the present invention is to provide an improved method for trimming capacitance values in a capacitive DAC.

Yet another object of the present invention is to provide an improved capacitive DAC with half-bit correction which can be trimmed to have precise capacitive values for use in analog to digital converters.

In carrying out the above and other objects, there is provided, in one form a capacitive DAC having capacitance means comprising a rank ordered plurality of capacitors. The capacitors have interconnected first electrodes for developing an analog output signal in response to a digital input code for determining which one of two reference voltages each of second electrodes of the capacitors are coupled to. Compensation means are coupled to at least a predetermined one of the rank ordered capacitors for selectively and precisely changing the effective value of the predetermined capacitor.

The above and other objects, features and advantages of the present invention will be more clearly understood from the following detailed description taken in conjunction with the accompanying drawings.

BRIEF DESCRIPTION OF THE DRAWINGS

FIG. 1 illustrates in schematic form a scaled n-bit capacitive DAC known in the art, where n is an integer;

FIGS. 9(a) and 9(b) illustrate in schematic form negative half bit correction and step size correction, respectively, for capacitive DAC structures used in an A/D application.

DESCRIPTION OF A PREFERRED EMBODIMENT

Figure 2A:
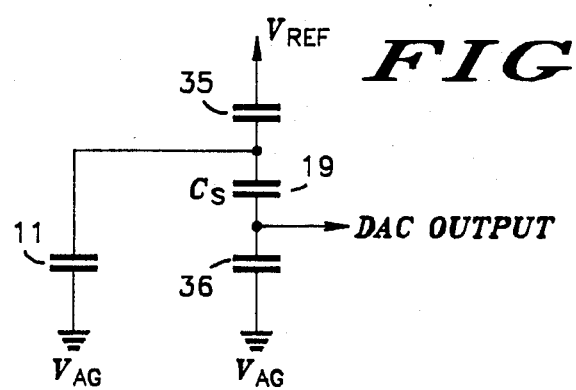
FIGS. 2(a) and 2(b) illustrate in schematic form an equivalent circuit of the scaled capacitive DAC of FIG. 1 for two predetermined switching arrangements.

Shown in FIG. 1 is a scaled n-bit capacitive DAC 10, where n is an integer, having a plurality of binarily weighted capacitors 12, 13, 14, 15, 16, 17, and 18. A first plate or electrode of each of capacitors 12, 13, 14 and 15 is coupled together to a first electrode of a scaling capacitor 19. A second electrode of capacitor 12 is coupled to an analog reference voltage, say $V_{AG}$. A second electrode of each of capacitors 13, 14 and 15 is coupled by switches 23, 24 and 25, respectively, to a predetermined one of either a reference voltage $V_{AG}$ or a reference voltage $V_{REF}$. Capacitors 16, 17 and 18 have a first electrode connected together and to a second electrode of scaling capacitor 19 to form a DAC output terminal. A second electrode of each of capacitors 16, 17 and 18 is coupled by switches 28, 29 and 30, respectively, to a predetermined one of either reference voltage $V_{AG}$ or reference voltage $V_{REF}$. In a commonly used form, capacitors 12, 13, 14 and 15 form a low ordered section of capacitors. Capacitors 12, 13 and 14 are weighted with 1, 1 and 2 units, respectively. Capacitor 15 is weighted as the most significant bit of the lower ordered section $C_{LMSB}$. Other binarily weighted capacitors may also be added in parallel with capacitors 14 and 15, as indicated by the dashed line, to increase the bit size of DAC 10. Capacitors 16, 17 and 18 form a high ordered section of capacitors. Capacitors 16 and 17 are weighted with 1 and 2 units, respectively, and capacitor 18 is weighted as the most significant bit of the high ordered section, $C_{MSB}$. Other binarily weighted capacitors may also be added in parallel with capacitors 17 and 18, as indicated by the dashed line, depending upon the bit size of DAC 10.

The DAC output is equal to the weighted analog equivalent of the digital input code plus a correction term referenced to the precharged voltage on the DAC output. The correction term is a step size correction which is contributed by capacitor 12. The theory behind this correction term is described below.

Capacitor 12 is commonly referred to as a step size correction capacitor. Capacitor 12 effectively adds one extra voltage step to DAC 10 thereby providing a total of $2^n$ steps for n bits such that one LSB equals $(\frac{1}{2}^n) \times V_{REF}$. The result is to make an input digital code of all ones provide a DAC output voltage which is one LSB below the reference voltage $V_{REF}$. For an eight bit DAC this would result in an output voltage which is $(255/256) V_{REF}$ and a midscale voltage of $(128/256) V_{REF}$ rather than $(128/255) V_{REF}$.

Figure 2B:
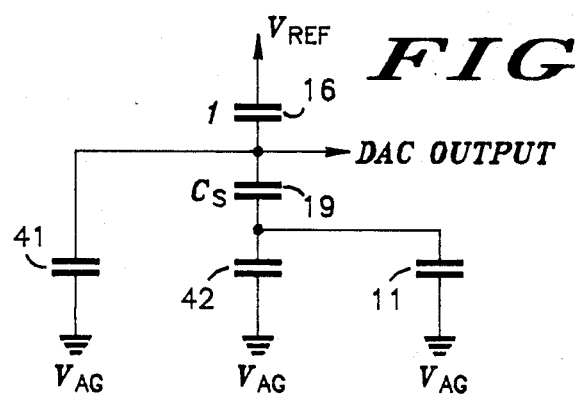

Shown in FIGS. 2(a) and 2(b) are equivalent circuits of DAC 10 for predetermined switching arrangements which are useful to calculate the value of scaling capacitor 19 having a capacitance of $C_S$. The total equivalent parallel capacitance of capacitors 12-15 of the lower ordered section of DAC 10 of FIG. 1, say $C_{LT}$, is represented by a capacitor 35 which has a first electrode coupled to the first electrode of scaling capacitor 19 and a second electrode coupled to reference voltage $V_{REF}$. Capacitor 11 represents all known parasitic capacitances, Cpar, which are coupled to the first electrode of scaling capacitor 19. Capacitor 11 is illustrated having its first electrode coupled to the first electrode of scaling capacitor 19 and its second electrode coupled to reference voltage $V_{AG}$. The total equivalent parallel capacitance of capacitors 16-18 of the higher ordered section of DAC 10, say $C_{MT}$, is represented by capacitor 36 having a first electrode coupled to both the second electrode of capacitor 19 and the DAC output terminal and a second electrode coupled to reference voltage $V_{AG}$.

A primary objective in the calculation of the value of $C_S$ is to maintain DAC 10 fully linear from LSB to MSB. This may be accomplished by making the change in voltage at the DAC output terminal which occurs when capacitors 12-15 in the lower ordered section are switched from reference voltage $V_{AG}$ to reference voltage $V_{REF}$ equal to the change in voltage at the DAC output terminal when the capacitor representing the lowest weighted bit in the higher ordered section, capacitor 16, is switched from reference voltage $V_{AG}$ to reference voltage $V_{REF}$.

When capacitors 12-15 are switched from reference voltage $V_{AG}$ to reference voltage $V_{REF}$, the resulting equivalent circuit of DAC 10 is shown in FIG. 2(a) and the voltage change, $\Delta V$, at the DAC output terminal is equal to:

$$\Delta V = \frac{Cs}{(Cs + C_{MT})} \times \frac{Clt}{[Clt + Cpar + 1/(1/Cs + 1/Cmt)]} V_{ref}$$

It can be readily be shown that:

$$\Delta V = \frac{(Cs)(Clt)(V_{ref})}{(Cs)(Clt) + (Clt)(Cmt) + (Cpar)Cs + (Cpar)Cmt + (Cs)(Cmt)} \quad (I)$$

The circuit of FIG. 2(b) illustrates the equivalent circuit of DAC 10 when the lowest weight bit in the higher ordered section is switched from reference voltage $V_{AG}$ to reference voltage $V_{REF}$. The second electrode of capacitor 16 is illustrated coupled to reference voltage $V_{REF}$, and the first electrode of capacitor 16 is coupled to the DAC output terminal. A capacitor 41 represents the total parallel capacitance of all higher ordered section capacitors absent the lowest ranked capacitor and is designated $C_{MT'}$ where $$C_{MT'} = C_{MT} - 1.$$

A first electrode of capacitor 41 is coupled to the DAC output terminal and a second electrode of capacitor 41 is coupled to reference voltage $V_{AG}$. Scaling capacitor 19 has its second electrode coupled to the DAC output terminal and its first electrode coupled to a first electrode of a capacitor 42 which represents the total equivalent parallel capacitance, $C_{LT}$, of capacitors 12-15 of the lower ordered section. Capacitor 42 is analogous to capacitor 35 of FIG. 2(a). The first electrode of capacitor 19 is also coupled to the first electrode of capacitor 11. Both capacitors 11 and 42 have a second electrode coupled to reference voltage $V_{AG}$.

For the switching arrangement of FIG. 2(b), it can be shown that the change in voltage, $\Delta V$, at the DAC output terminal after switching capacitor 16 from $V_{AG}$ to $V_{REF}$ is:

$$\Delta V = [1/[Cmt' + 1 + [1/(1/Cs + 1/(Clt-Cpar))]]] \times V_{REF}$$

It can be readily shown that this equation is the following:

$$\Delta V = \frac{Clt + Cpar + Cs}{CmtClt + (Cpar)Cmt + CsCmt + CsClt + (Cpar)Cs} V_{REF} \quad (II)$$

Equating equations (I) and (II) which represent the change in output voltage for both switching arrangements of FIGS. 2(a) and 2(b), respectively, results in the following equation:

$$C_s C_{LT} = C_{LT} + C_{par} + C_s.$$

Solving for the scaling capacitor, Cs, results in the following equation:

$$C_s = \frac{Clt + Cpar}{Clt - 1}$$

By virtue of the derived equation for scaling capacitor values, a means to trim MSB capacitive components or capacitive components near the MSB in DAC 10 may be provided. Generally, error in the output voltage of DAC 10 is due in large part to an inability to accurately match parasitic capacitance associated with the more heavily weighted capacitors of DAC 10. The equation for the scaling capacitor Cs illustrates that the value of the scaling capacitor is determined by only the total capacitive value of the lower ordered section of the DAC including parasitic capacitance. For the purpose of calculating the value of Cs, the value and the switching of the capacitors of the higher ordered section of DAC 10 is irrelevant.

As is commonly known in the art, a "bipolar" DAC is a DAC which utilizes both positive and negative voltages for providing an output voltage in both positive and negative directions. In contrast, a "unipolar" DAC is a DAC which utilizes only a single polarity voltage for providing an output voltage of a single polarity.

Figure 3:
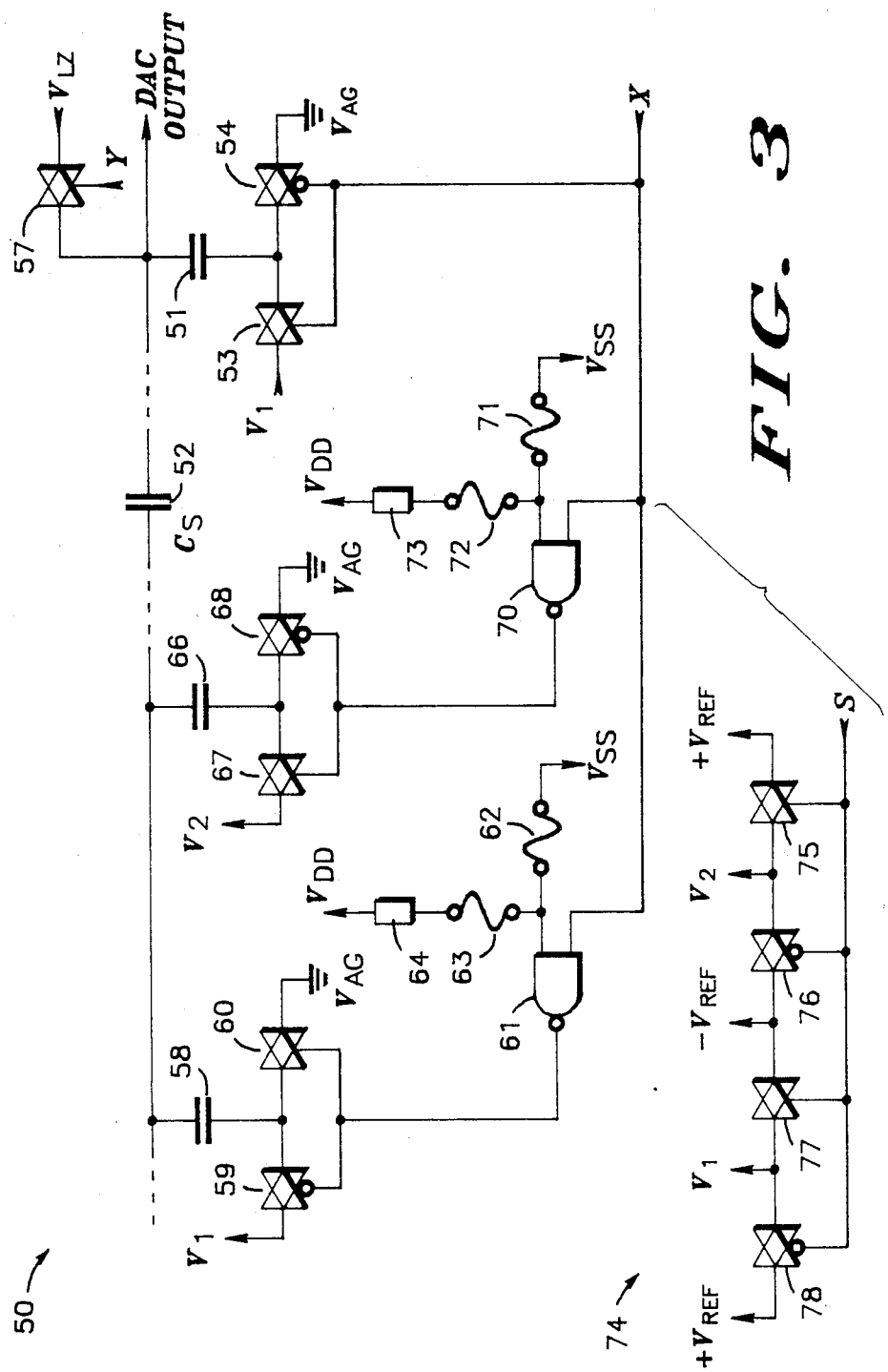
FIG. 3 illustrates in schematic form a trimmed capacitive DAC.

Shown in FIG. 3 is a DAC circuit 50 for precisely trimming a capacitor 51 having a first electrode coupled to both a DAC output terminal and a first electrode of a scaling capacitor 52 having a capacitive value Cs. A second electrode of capacitor 51 is coupled to both a first terminal of a switch 53 and a first terminal of a switch 54. In the preferred embodiment, all switches which are described are CMOS transmission gates which are clocked in a conventional manner. Switches 53 and 54 both have a control electrode of opposite conductivity type coupled together to a control signal X, and switch 54 has a second terminal coupled to a reference voltage, say analog ground $V_{AG}$. A second terminal of switch 53 is coupled to a predetermined analog voltage $V_1$. A switch 57 has a first terminal coupled to the first electrode of capacitor 51 and a second terminal coupled to a low impedance voltage source labeled $V_{LZ}$. A control electrode of switch 57 is coupled to a control signal Y. A compensating capacitor 58 has a first electrode coupled to a second electrode of scaling capacitor 52 and a second electrode coupled to a first terminal of a pair of switches 59 and 60. Switch 59 has a second terminal coupled to analog voltage $V_1$, and switch 60 has a second terminal coupled to reference voltage $V_{AG}$. Control electrodes of opposite conductivity type of switches 59 and 60 are coupled to an output of a NAND gate 61. NAND gate 61 has a first input coupled to the control signal X and a second input coupled to a first terminal of both a link 62 and a link 63. Link 62 also has a second terminal coupled to a digital ground supply voltage $V_{SS}$. Link 63 has a second terminal coupled to a first terminal of a load means 64. Load means 64 have a second terminal coupled to a digital supply voltage $V_{DD}$. A compensating capacitor 66 has a first electrode coupled to a second electrode of scaling capacitor 52, and a second electrode coupled to a first terminal of a pair of switches 67 and 68. Switch 67 has a second terminal coupled to a second predetermined analog voltage $V_2$, and switch 68 has a second terminal coupled to reference voltage $V_{AG}$. Control electrodes of opposite conductivity type of switches 67 and 68 are coupled to an output of a NAND gate 70. NAND gate 70 has a first input coupled to the control signal X and a second input coupled to a first terminal of both a link 71 and a link 72. Link 72 also has a second terminal coupled to a first terminal of a load means 73. Load means 73 have a second terminal coupled to supply reference voltage $V_{DD}$. Load means 64 and 73 function to prevent a direct short circuit between supply voltages $V_{DD}$ and $V_{SS}$ when both links 62 and 63 or both links 71 and 72 are conductive, respectively. Other load means to be discussed below have an analogous function. The second terminal of link 71 is coupled to ground voltage $V_{SS}$. An analog reference multiplexer section 74 provides the analog reference voltages $V_1$ and $V_2$ as a function of the sign of the DAC output voltage. A switch 75 has a first terminal coupled to a positive analog reference voltage $+V_{REF}$ and a control electrode of a first conductivity type coupled to a sign bit S associated with circuit 50. A switch 76 has a first terminal coupled to a second terminal of switch 75 which provides the predetermined analog voltage $V_2$. A control electrode of a second conductivity type of switch 76 is coupled to the sign bit S, and a second terminal of switch 76 is coupled to both a negative analog reference voltage $-V_{REF}$ and a first terminal of a switch 77. Switch 77 has a control electrode of the first conductivity type coupled to sign bit S and a second terminal coupled to a first terminal of a switch 78. The second terminal of switch 77 provides the predetermined analog voltage $V_1$. A control of the second conductivity type of switch 78 is coupled to sign bit S, and a second terminal of switch 78 is coupled to the positive analog reference voltage $+V_{REF}$.

In the illustrated form, circuit 50 may be readily adapted for bipolar D/A conversion. The voltage at the DAC output, $V_{OUT}$, during the valid output period is:

$$V_{OUT} = V_{LZ} + V_1(C_{ON}/C \text{ total})$$

where $C_{ON}$ is the capacitance of the capacitors which are switched to $V_1$ and C total is the total capacitance of all switched capacitors and parasitic capacitance associated with the DAC as seen at the DAC output node relative to ground. Analog voltage $V_1$ is equivalent to $+V_{REF}$ for a DAC output voltage which is more positive than analog ground $V_{AG}$. Similarly, analog voltage $V_1$ is equivalent to $-V_{REF}$ for a DAC output voltage which is more negative than analog ground $V_{AG}$.

Figure 4:
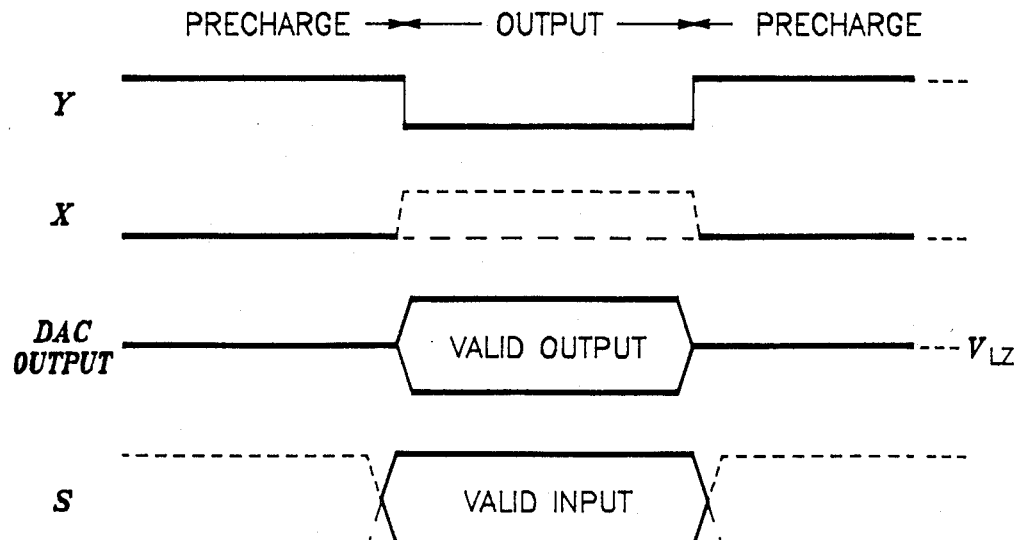
FIG. 4 illustrates in graphical form waveforms of signals associated with the trimmed capacitive DAC of FIG. 3.

Shown in FIG. 4 are waveforms of signals associated with circuit 50 for a D/A operation. Signal Y controls the precharge and valid output timing of the D/A converter. During a precharge period, the control signal X is at a logic low level thereby preconditioning the outputs of NAND gates 61 and 70 to provide for subsequent capacitive trimming. Outside of the precharge period, the control signal X remains at either a high or a low logic level as shown by the two dashed lines. The logic level of the control signal X is determined by a digital input code which is being converted. During the precharge period, the DAC output signal is under the control of the low impedance source $V_{LZ}$ and settles to a predetermined voltage level. During the valid output period, the DAC output signal changes to an analog voltage level determined by the digital input code as shown by the two dashed lines.

In a capacitive trimming operation, capacitors 58 and 66 are used to compensate capacitor 51. If capacitors 58 and 66 are small, very fine trimming of the effective value of capacitor 51 may be achieved. Capacitors 58 and 66 contribute to the parasitic capacitance term of the equation for scaling capacitor 52 because they are under the control of control signals associated with the switched capacitors of the higher order section of circuit 50 rather than the lower order section. The capacitive value of scaling capacitor 52 is therefore calculated by using the capacitance of trimming capacitors 58 and 66, the capacitance of the capacitors of the lower ordered section and any associated parasitic capacitance as per the derived equation for the scaling capacitance Cs. NAND gates 61 and 70 are used to control the switching of capacitors 58 and 66, respectively. NAND gates 61 and 70 may be either "enabled" or "disabled" by associated links. When either NAND gate is enabled by connecting a high logic level to a predetermined one of the inputs thereof, the logic state of the output of the NAND gate is determined solely by control signal X.

When either NAND gate is disabled by connecting a low logic level to a predetermined one of the inputs thereof, the logic state of the output of the NAND gate is fixed so that control signal X has no effect on the output of the NAND gate. Initially, NAND gates 61 and 70 are disabled by links 62 and 71 and capacitor 51 has an original nominal capacitive value. When NAND gate 61 is enabled by opening or blowing link 62, the control signal X thereby totally controls the switching of capacitor 58. When NAND gate 61 becomes enabled, the effective capacitive value of capacitor 51 is increased due to the configuration of switches 59 and 60. The effective capacitive value $C'_{51}$ of capacitor 51 becomes:

$$C'_{51} = C_{51} + C_{58}[\tfrac{1}{2}^n]$$

where
$C_{51}$ = capacitance of capacitor 51;
$C_{58}$ = capacitance of capacitor 58; and
n = the order of the least significant section of the DAC.

Similarly, if link 62 is not blown and link 71 is blown, the effective capacitance of capacitor 51 becomes:

$$C'_{51} = C_{51} - C_{66}[\tfrac{1}{2}^n]$$

This particular equation for decremental capacitive trimming using capacitor 66 results from the fact that the predetermined analog voltage $V_2$ is always the arithmetic negative of analog voltage $V_1$ assuming that the two reference voltages are substantially equal in absolute magnitude. Therefore, by selectively blowing predetermined links of circuit 50, the effective capacitive value of capacitor 51 may be trimmed up or down.

Regardless of how capacitor 51 is trimmed, the DAC remains linear with any amount of trimming if the value of the scaling capacitor is calculated in accordance with the derived equation. Links 63 and 72 are blown to eliminate DC current which exists between supply voltage $V_{DD}$ and ground voltage $V_{SS}$ if NAND gates 61 and 70 are left disabled.

As illustrated in FIG. 3, the effective value of any capacitor which is in the higher ordered or most significant section of a ladder-type DAC may be trimmed using this method of selectively coupling capacitors 58 and 66. Further, multiple capacitor effective values in the higher ordered section of DAC 10 may be trimmed by additional circuits similar to circuit 50. Additional trimming capacitors similarly affect the value of the scaling capacitor 52 in accordance with the derived equation. It should be clear that the present invention may be practiced without the use of a scaling capacitor in a capacitive structure. However, the use of a scaling capacitor reduces the capacitor ratios required for the DAC, thereby reducing the physical size and allowing for smaller trimming steps since the trim value is reduced by the capacitor divider ratio. This technique overcomes the limitation of physical constraints on how small a capacitor can be.

The links illustrated in FIG. 3 and the following circuits to be described below may be of various types. Commonly used links are fusible links, EPROM bits, and laser trimmed links.

Another form of the present invention is to use several addition/subtraction trimming capacitors per MSB ladder capacitor. This correction method may also be used to trim nearly any amount of uniform DC offset voltage existing within DAC 10 if control signal Y is used to control the trimming capacitors. Further, the attenuation effect of the trimming capacitors and associated parasitics can be readily mathematically shown to be minor.

Figure 5:
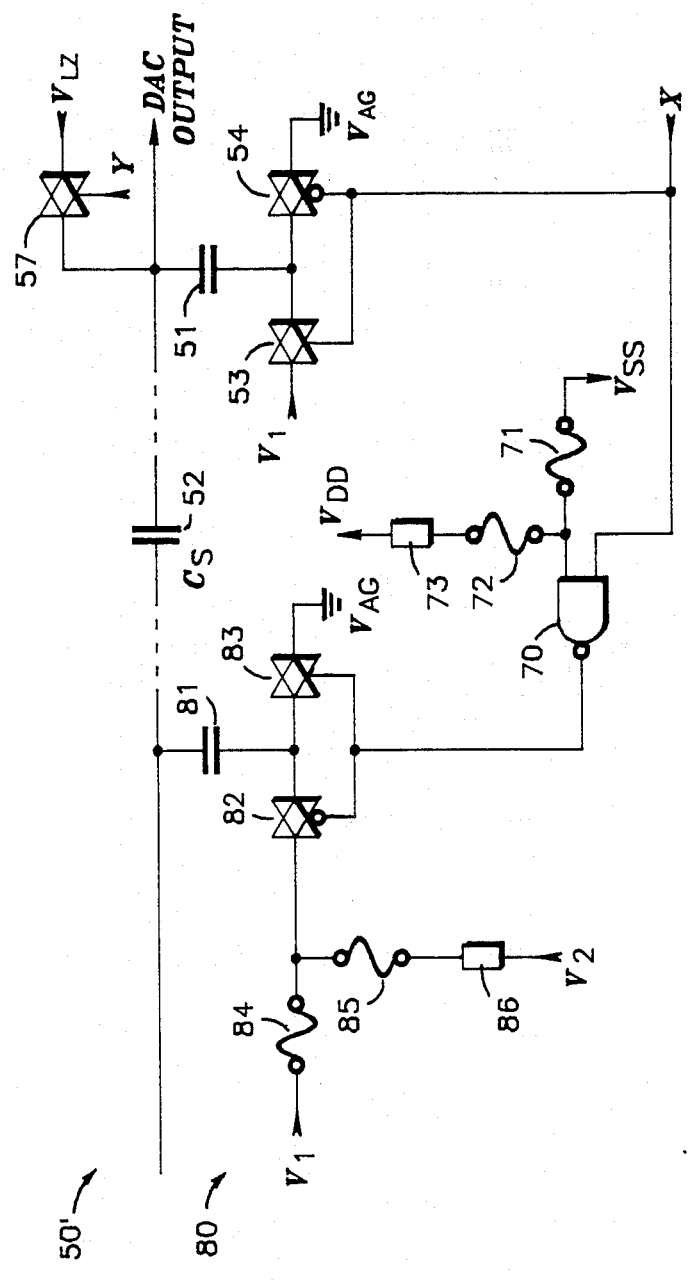
FIG. 5 illustrates in schematic form a second embodiment of a trimmed capacitive DAC.

Shown in FIG. 5 is a circuit 50' which is a second embodiment of circuit 50 of FIG. 3 having a modified trimming section 80. Trimming section 80 comprises a trimming capacitor 81 having a first electrode coupled to the first electrode of scaling capacitor 52, and a second electrode connected to first terminals of both switches 82 and 83. A second terminal of switch 83 is connected to analog ground $V_{AG}$, and a second terminal of switch 82 is connected to first terminals of both a link 84 and a link 85. A control electrode of the first conductivity type of switch 83 and a control electrode of the second conductivity type of switch 82 are connected together and to the output of NAND gate 70. A second terminal of link 84 is coupled to analog reference voltage $V_1$, and a second terminal of link 85 is connected to a first terminal of a load means 86. A second terminal of load means 86 is coupled to analog reference voltage $V_2$.

In operation, circuit 50' is a DAC having only one trimming capacitor 81 which is capable of adding or subtracting capacitance to or from, respectively, capacitor 51. NAND gate 70 is enabled in an analogous manner as described before by control signal X of FIG. 4. Initially, NAND gate 70 is disabled so that no capacitance change to the effective value of capacitor 51 is made. When NAND gate 70 is enabled so that control signal X determines the state of the output of NAND gate 70, the equivalent value of capacitor 51 is modified by $C_{81}/2^n$ where $C_{81}$ is the capacitive value of capacitor 81. If link 84 is enabled and link 85 is disabled, capacitor 81 is switched in phase with capacitor 51 to increase its effective value. If link 85 is enabled and link 84 is disabled, capacitor 81 is switched out of phase with capacitor 51 to decrease its effective value. This accomplishes the same function as the circuit of FIG. 3 but with fewer logic gates. The DAC output signal and associated control signals illustrated in FIG. 4 apply to FIG. 5 in the same way as they apply to circuit 50 of FIG. 3.

Figure 6:
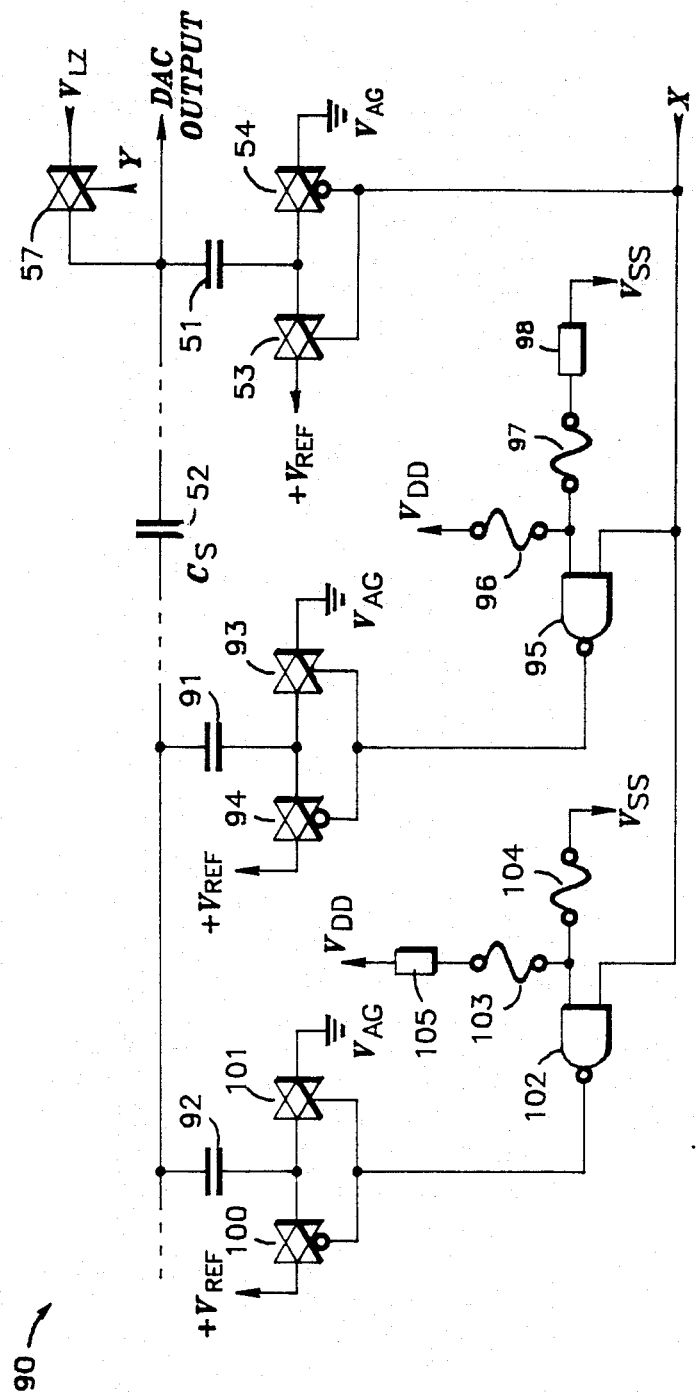
FIG. 6 illustrates in schematic form a trimmed capacitive DAC.

Shown in FIG. 6 is a unipolar DAC 90 having only a single reference voltage relative to analog ground $V_{AG}$ for providing an output voltage of only one polarity. In the illustrated form, the reference voltage shown is positive, $+V_{REF}$, but a negative polarity reference voltage may also be used. Scaling capacitor 52, capacitor 51, and switches 53, 54 and 57 are connected in the same manner as in circuit 50 with the exception that the second terminal of switch 53 is coupled to $+V_{REF}$ rather than to reference voltage $V_1$. Again, capacitor 51 is a predetermined capacitor of a higher order section of DAC 90. Other capacitors may also be added in parallel with capacitors 51 and 52, as indicated by the dashed line, to increase the bit size of DAC 90. Both a trimming capacitor 91 and a trimming capacitor 92 have a first electrode coupled to the first electrode of scaling capacitor 52. Other capacitor (not shown) may also be added in parallel with scaling capacitor 52 and the capacitors 58, 66 of a lower order section of DAC 90, as indicated by the dashed line, to increase the bit size of DAC 90. A second electrode of capacitor 91 is connected to both a first terminal of a switch 93 and a first terminal of a switch 94. A second terminal of switch 93 is connected to analog ground $V_{AG}$. A second terminal of switch 94 is coupled to reference voltage $+V_{REF}$. A control electrode of the first conductivity type of switch 93 and a control electrode of the second conductivity type of switch 94 are connected together to an output of a NAND gate 95. A first input of NAND gate 95 is coupled to control signal X, and a second input of NAND gate 95 is connected to a first terminal of both a link 96 and a link 97. A second terminal of link 96 is coupled to digital supply voltage $V_{DD}$, and a second terminal of link 97 is coupled to a first terminal of a load means 98. A second terminal of load means 98 is coupled to digital ground supply voltage $V_{SS}$. A second electrode of capacitor 92 is coupled to a first terminal of a switch 100 and a switch 101. A second terminal of switch 100 is coupled to reference voltage $+V_{REF}$, and a second terminal of switch 101 is coupled to analog ground. A control electrode of the first conductivity type of switch 101 is connected to both a control electrode of the second conductivity type of switch 100 and an output of a NAND gate 102. A first input of NAND gate 102 is coupled to control signal X, and a second input of NAND gate 102 is connected to a first terminal of both a link 103 and a link 104. A second terminal of link 103 is connected to a first terminal of a load means 105 which has a second terminal coupled to digital supply voltage $V_{DD}$. A second terminal of link 104 is coupled to digital ground supply voltage $V_{SS}$.

In operation, trimming capacitors 91 and 92 function to add a predetermined amount of capacitance to capacitor 51 when NAND gates 95 and 102 are enabled and the outputs of NAND gates 95 and 102 are directly responsive to control signal X. Initially, links 96 and 97 are conductive to enable NAND gate 95 to be controlled by control signal X, and links 103 and 104 disable NAND gate 102 so that control signal X does not affect the value of the output of NAND gate 102. Therefore, the initial effective value of the capacitance to be adjusted, $C'_{51}$, is the sum of the capacitance of capacitor 51 and the weighted effect of capacitor 91. In order to add to the initial value of capacitance, link 104 is disabled and link 103 is enabled, thereby allowing the output of NAND gate 102 to be controlled by control signal X. Therefore, the capacitance is adjusted up by the weighted value of capacitor 92 when control signal X switches the second electrode of capacitor 92 between $+V_{REF}$ and $V_{AG}$. Capacitor 91 can be used to subtract a predetermined capacitance by disabling link 96 and enabling link 97 thereby disabling the output of NAND gate 95 to prevent switches 93 and 94 from switching the second electrode of capacitor 91 between $V_{AG}$ and $+V_{REF}$, respectively. Therefore, the initial effect of capacitor 91 is removed from the effective capacitance of $C'_{51}$. Signals associated with circuit 90 are illustrated in FIG. 4.

Up to this point in the description, all circuits illustrated are intended for stand alone D/A applications. However, the circuits may be modified for use in an A/D application where the total capacitance of the DAC can also function as a sampling capacitor.

Figure 7:
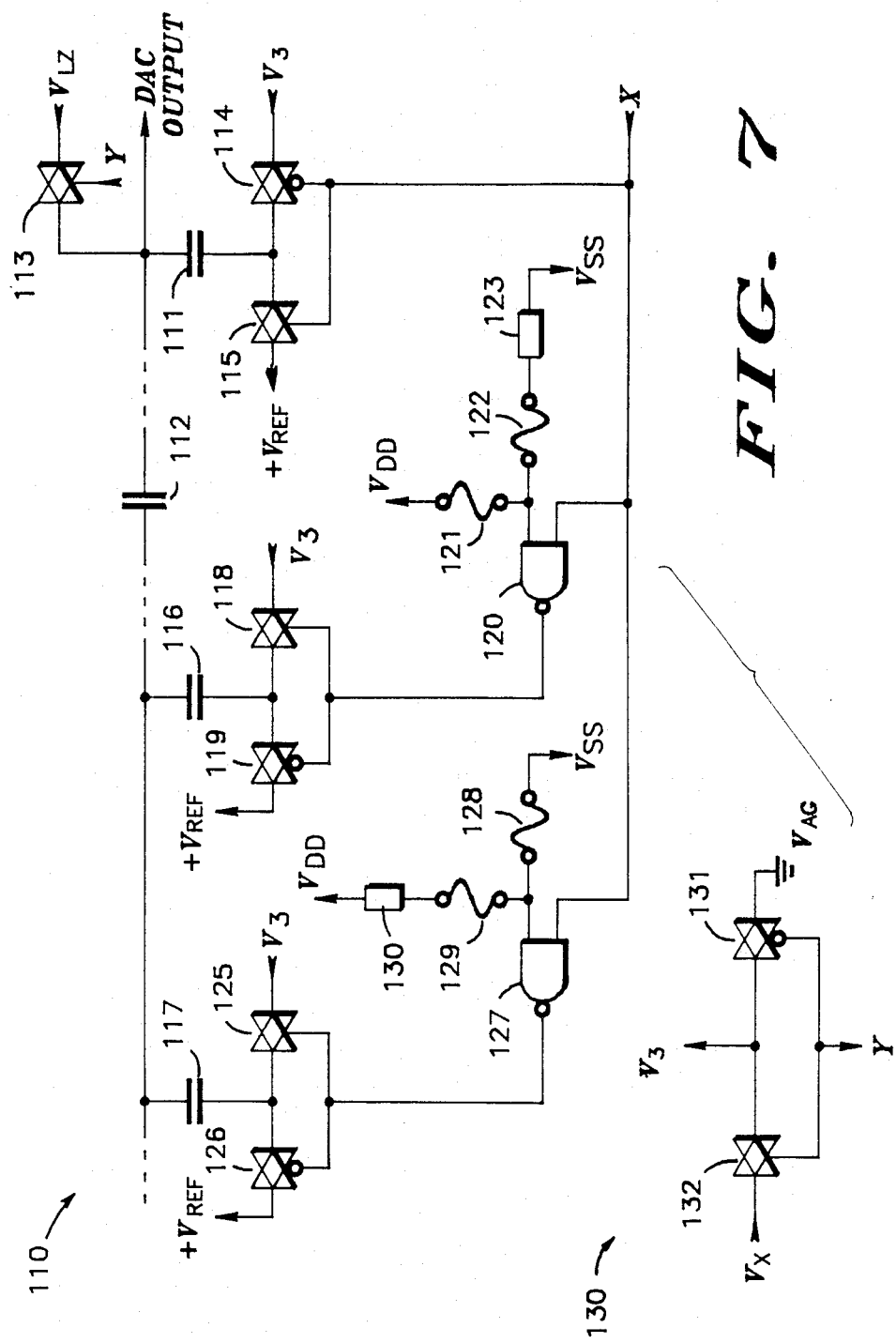
FIG. 7 illustrates in schematic form a second embodiment of a trimmed capacitive DAC.

A typical application of a capacitive structure as an internal functional block of an integrated analog subsystem is shown in FIG. 7. Circuit 110 functions as a capacitive DAC which allows the DAC to also be used as a sample and hold capacitor for the unknown analog voltages being converted in an SAR implementation of an analog to digital conversion. Circuit 110 is unipolar and comprises a predetermined capacitor 111 having a first electrode coupled to both an output terminal and a first electrode of a scaling capacitor 112. Other capacitors not shown may also be added in parallel with capacitors 111 and 112 to increase the bit size of circuit 110. A switch 113 has a first terminal coupled to the output terminal, a second terminal coupled to the low impedance source $V_{LZ}$, and a control electrode coupled to control signal Y. A first terminal of a switch 114 is coupled to a predetermined analog voltage $V_3$. Switch 114 has a second terminal connected to a first terminal of a switch 115 and to a second electrode of capacitor 111. A second terminal of switch 115 is coupled to the positive analog reference voltage $+V_{REF}$. Switch 115 has a control electrode of the first conducitivity type connected to a control electrode of the second conductivity type of switch 114 and to control signal X. A trimming capacitor 116 has a first electrode connected to a first electrode of a trimming capacitor 117 and coupled to a second electrode of scaling capacitor 112. Other capacitors may be connected to the second electrode of scaling capacitor 52 to increase, in part, the bit size of DAC circuit 50. A switch 118 has a first terminal connected to both a second electrode of capacitor 116 and a first terminal of a switch 119. A second terminal of switch 118 is coupled to the predetermined analog voltage $V_3$, and a second terminal of switch 119 is coupled to reference voltage $+V_{REF}$. Switch 118 has a control electrode of the first conductivity type connected to both a control electrode of the second conductivity type of switch 119 and an output of a NAND gate 120. NAND gate 120 has a first input coupled to control voltage X and a second input coupled to both a first terminal of a link 121 and a link 122. A second terminal of link 121 is coupled to digital supply voltage $V_{DD}$, and a second terminal of link 122 is connected to a first terminal of a load means 123. A second terminal of load means 123 is coupled to digital ground supply voltage $V_{SS}$. A second electrode of capacitor 117 is connected to a first terminal of both a switch 125 and a switch 126. A second terminal of switch 125 is coupled to analog voltage $V_3$, and a second terminal of switch 126 is coupled to reference voltage $+V_{REF}$. Switch 125 has a control electrode of the first conductivity type connected to both a control electrode of the second conductivity type of switch 126 and an output of a NAND gate 127. A first input of NAND gate 127 is coupled to control voltage X, and a second input of NAND gate 127 is connected to both a first terminal of a link 128 and a link 129. A second terminal of link 128 is coupled to digital supply voltage $V_{SS}$. A second terminal of link 129 is coupled to a first terminal of a load means 130, and a second terminal of load means 130 is coupled to digital supply voltage $V_{DD}$. An analog voltage multiplexer section provides analog voltage $V_3$ as a function of control signal Y so that voltage $V_3$ is either voltage $V_X$ or voltage $V_{AG}$. A switch 131 has a first terminal connected to analog ground $V_{AG}$ and a second terminal connected to a first terminal of a switch 132 for providing analog voltage $V_3$. A second terminal of switch 132 is connected to an unknown analog voltage $V_X$ which is to be sampled. A control electrode of the first conductivity type of switch 132 is connected to both a control electrode of the second conductivity type of switch 131 and control voltage Y.

Figure 8:
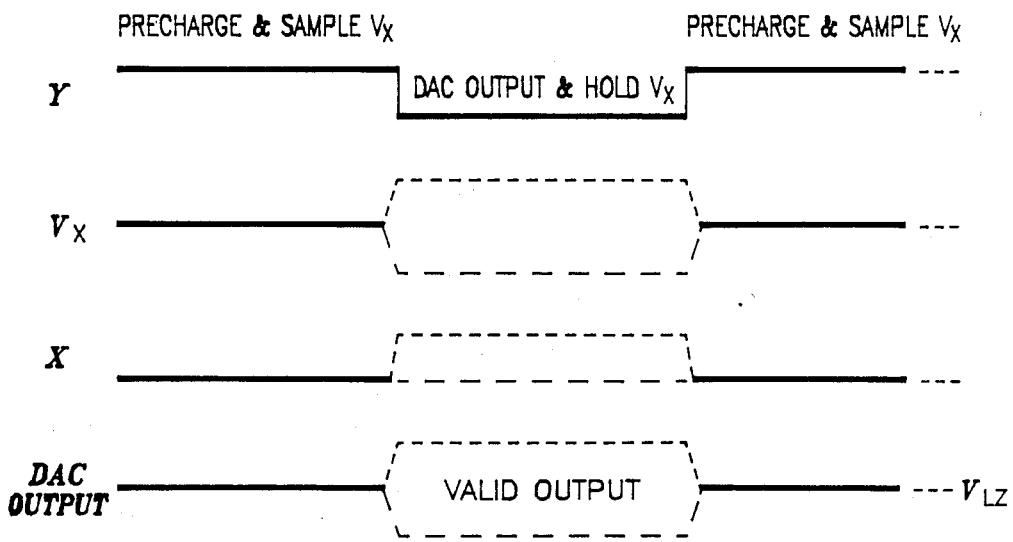
FIG. 8 illustrates in graphical form waveforms of signals associated with the trimmed capacitive DAC of FIG. 7.

In operation, the value of the initial capacitance which control signal X appears to switch is the sum of capacitor 111, the weighted capacitive value of capacitor 116, plus associated parasitics. To subtract a predetermined amount of capacitance from the initial capacitance, NAND gate 120 is disabled so that control signal X does not affect the output of NAND gate 120. The second electrode of capacitor 116 is connected to voltage $V_3$ and switches 118 and 119 do not switch the second electrode of capacitor 116 between voltages $V_3$ and $+V_{REF}$, respectively. To add a predetermined amount of capacitance to capacitor 111 utilizing the conservation of charge theory, capacitors 116 and 117 are both enabled by NAND gates 120 and 127, respectively, so that switches 118, 119 and 125, 126 switch the second electrodes of capacitors 116 and 117, respectively, between voltage $V_3$ and voltage $+V_{REF}$. Shown in FIG. 8 are signals associated with the operation of the circuit of FIG. 7; As is illustrated in FIG. 8, control signal Y controls the functional operation of the output between precharge and valid output. During the time that DAC 110 is being precharged by the low impedance source $V_{LZ}$, the second electrodes of capacitors 111, 116, 117 and other capacitors not shown are precharged to unknown voltage $V_X$ in order to sample voltage $V_X$ onto the total DAC capacitance. After the Y control signal makes a high to low transition, the output of the DAC is determined by the digital inputs of which control signal X is a representative one. The digital inputs are externally generated and are a digital representation of the voltage which is being converted. At this point, the unknown analog voltage $V_X$ is disconnected from all capacitors and its value is thus held on DAC 110 because of the conservation of charge theory and the fact that the output node is a floating node. During a valid output period, the voltage on the DAC output is governed by the following equation:

$$V_{OUT} = V_{LZ} - V_X + V_{ref}(C_{ON}/C\ \text{total}),$$

where

"$C_{ON}$" is the capacitance of the capacitors which are switched to $+V_{REF}$ and "C total" is the total capacitance of all switched capacitors and parasitic capacitance associated with DAC 110.

Shown in FIG. 9(a) is a negative half bit correction circuit commonly used in an A/D application comprising a capacitor 135 having a first electrode which is coupled to the second electrode of scaling capacitor 112 of FIG. 7. Capacitor 135 has a second electrode connected to a first terminal of a switch 136 for connecting the second electrode of capacitor 135 to either analog ground $V_{AG}$ or to reference voltage $V_{REF}$. The first electrode of capacitor 112 is coupled to both the low impedance source $V_{LZ}$ via a switch 137 and to the DAC output. Capacitor 135 is weighted one-half unit of capacitance in relation to the absolute value of the LSB capacitor.

As an illustration of the operation of capacitor 135, assume initially that capacitor 135 is charged to reference voltage $V_{REF}$ during a precharge period by switch 136. During the precharge period, the DAC output is connected to the low impedance source $V_{LZ}$. When the second electrode of capacitor 135 is switched to reference voltage $V_{AG}$ during a valid output period via switch 136 and the DAC output is disconnected from $V_{LZ}$, charge redistribution on the DAC, designated by Q in FIG. 9(a), causes a negative voltage change equivalent in magnitude to one-half of a least significant bit (LSB) on the DAC output.

Shown in FIG. 9(b) is a circuit for step size correction of the DAC 110 of FIG. 7. A step size correction capacitor 138 has a first electrode coupled to the second electrode of scaling capacitor 112 and a second electrode connected to a first terminal of switch 139 for connecting the second electrode of capacitor 138 to either unknown analog voltage $V_X$ or to analog voltage $V_{AG}$. Capacitor 138 is weighted one unit of capacitance.

Capacitor 138 functions to accomplish a step size correction equivalent to capacitor 12 in DAC 10 of FIG. 1. However, in order to avoid a gain error in the unknown sampled analog voltage, capacitor 138 must initially be precharged to the unknown analog voltage $V_X$. During the valid DAC output period, capacitor 138 is then switched to $V_{AG}$ accomplishing a step correction. Step size correction illustrated in FIG. 9(b) can be automatically accomplished simply by coupling the second terminal of capacitor 138 to analog voltage $V_3$ which is the output of multiplexer circuit 137.

Therefore, by now it should be apparent that a capacitive structure having capacitors which can be accurately trimmed and used in both A/D and D/A applications has been provided. Although in a preferred form a scaling capacitor has been shown with each capacitive structure, the present invention may be practiced with no scaling capacitor. Further, the present invention may also be used to trim capacitive values in other types of charge redistribution circuits, including switched capacitor filters.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A capacitive digital to analog converter which can be trimmed up and down to add to and subtract from capacitance of the converter, respectively, for providing a precise analog output signal corresponding to a digital input code, comprising:
   converter capacitance means having a rank ordered plurality of capacitors having interconnected first electrodes, and respective second electrodes each of which is controllably coupled to a predetermined one of first and second reference voltages, for developing the analog output signal on the first electrodes as a function of the digital input code;
   trim capacitance means coupled to at least a predetermined one of said rank ordered capacitors, for selectively storing either the first or second reference voltage depending upon whether said converter is to be trimmed up or down, respectively;
   switching means coupled to the trim capacitance means, for selectively coupling either the first or second reference voltage to the trim capacitance means in response to a trim signal; and
   control means coupled to the switching means for providing the trim signal in response to first and second control signals, said first control signal indicating whether or not a trim operation is necessary and said second control signal indicating when to add or subtract a predetermined amount of capacitance to a predetermined one of the rank ordered capacitors.

2. The capacitive digital to analog converter of claim 1 further comprising:
   a scaling capacitor having a first electrode coupled to the predetermined one of the rank ordered plurality of capacitors, and a second electrode coupled to the trim capacitance means, for scaling the size of the predetermined capacitor of the rank ordered plurality of capacitors.

3. The capacitive digital to analog converter of claim 1 wherein said switching means comprise:
- a first switch having a first terminal coupled to a predetermined one of the first or second reference voltage, a second terminal coupled to said trim capacitance means, and a control electrode coupled to said trim signal; and
- a second switch having a first terminal coupled to an analog ground reference voltage, a second terminal coupled to said trim capacitance means, and a control electrode coupled to said trim signal, wherein said first and second switches are made conductive in response to the presence of the trim signal in first and second states, respectively.

4. The capacitive digital to analog converter of claim 1 wherein said control means comprise:
- a logic gate having an output coupled to said switching means for providing the trim signal, a first input coupled to a terminal for receiving the second control signal, and a second input;
- first link means having a first terminal coupled to the second input of the logic gate, and a second terminal coupled to a first supply voltage, for selectively linking the first supply voltage to the second input of the logic gate; and
- second link means having a first terminal coupled to the second input of the logic gate, and a second terminal coupled to a second supply voltage, for selectively linking the second supply voltage to the second input of the logic gate.

5. A capacitive digital to analog converter which can be trimmed for providing a precise analog output signal corresponding to a digital input code, comprising:
- capacitance means having a rank ordered plurality of capacitors having interconnected first electrodes, and respective second electrodes each of which is controllably coupled to a predetermined reference voltage, for developing the analog output signal on the first electrodes as a function of the digital input code;
- first and second trimming capacitors, each trimming capacitor having a first electrode coupled to the interconnected first electrodes of said capacitance means, and a second electrode;
- first and second switching means respectively coupled to the second electrode of the first and second trimming capacitors, for selectively coupling the second electrode thereof to one of either a first or a second reference voltage in response to first and second trim signals, respectively;
- a first logic gate having a first input coupled to a control signal for controlling when to add or subtract capacitance, a second input, and an output for providing the first trim signal;
- first link means having a first terminal coupled to the second input of the first logic gate, and a second terminal coupled to a first supply voltage, for selectively linking the supply voltage to the second input of the first logic gate;
- first load means having a first terminal coupled to a second supply voltage, and a second terminal;
- second link means having a first terminal coupled to the second terminal of the first load means, and a second terminal coupled to the second input of the first logic gate, for selectively linking the first reference voltage to the second input of the first logic gate;
- a second logic gate having a first input coupled to the control signal, a second input and an output, for providing the second trim signal;
- third link means having a first terminal coupled to the second input of the second logic gate, and a second terminal coupled to the first supply voltage, for selectively linking the first supply voltage to the second input of the second logic gate;
- second load means having a first terminal coupled to the second supply voltage, and a second terminal; and
- fourth link means having a first terminal coupled to the second terminal of the second load means, and a second terminal coupled to the second input of the second logic gate, for selectively linking the second input of the second logic gate to the first reference voltage.

6. The capacitive digital to analog converter of claim 5 wherein said first and second link means are solid state memory bits.

7. The capacitive digital to analog converter of claim 5 wherein said first and second link means are fusible links.

8. The capacitive digital to analog converter of claim 5 wherein said first and second link means are laser trimmed links.

9. A capacitive digtal to analog converter comprising:
- capacitance means having a rank ordered plurality of capacitors having interconnected first electrodes, and respective second electrodes each of which is controllably coupled to a predetermined one of first and second reference voltages, for developing the analog output signal on the first electrodes as a function of the digital input code;
- a trimming capacitor having a first electrode coupled to the interconnected first electrodes of said capacitance means, and a second electrode;
- switching means coupled to the second electrode of said trimming capacitor for selectively coupling the second electrode to one of either the first or second reference voltage in response to a trim signal;
- a logic gate having a first input coupled to a control signal, a second input, and an output for providing the trim signal for either only adding or only subtracting a predetermined capacitance from the predetermined one of the rank ordered capacitors via the trimming capacitor;
- first link means having a first terminal coupled to a first supply voltage, and a second terminal coupled to the second input of the logic gate, for selectively coupling the first supply voltage to the logic gate;
- load means having a first terminal coupled to a second supply voltage, and a second terminal; and
- second link means having a first terminal coupled to the second terminal of the load means, and a second terminal coupled to the second input of the logic gate, for selectively coupling the second supply voltage to the logic gate.

10. The capacitive digital to analog converter of claim 9 wherein said first and second link means are solid state memory bits.

11. The capacitive digital to analog converter of claim 9 further comprising:

a second trimming capacitor having a first electrode coupled to the interconnected first electrodes of said capacitance means, and a second electrode;

second switching means coupled to the second electrode of the second trimming capacitor for selectively coupling the second electrode to one of either the first or second reference voltages in response to a second trim signal; and control means coupled to the second switching means for providing the second trim signal, wherein said second trimming capacitor selectively adds or subtracts a predetermined capacitance to the predetermined one of the rank ordered capacitors.

12. The capacitive digital to analog converter of claim 9 wherein said first and second link means are fusible links.

13. The capacitive digital to analog converter of claim 9 wherein said first and second link means are laser trimmed links.

14. A method of trimming at least one predetermined capacitor of a capacitive digital to analog converter either up or down to respectively increase or decrease capacitance of the predetermined capacitor, comprising the steps of:

providing a capacitive DAC having a rank ordered plurality of capacitors;

coupling a trimming capacitor to a predetermined one of the rank ordered plurality of capacitors;

coupling switching means to the trimming capacitor, for selectively switching first and second reference voltages to the trimming capacitor, said first and second reference voltages having opposite polarities with respect to a ground voltage; and providing controlled logic means for providing a control signal to control the switching means, said logic means being controlled by fuseable links which control whether or not a capacitive trim occurs.

* * * * *